US006656341B2

(12) United States Patent
Petersson et al.

(10) Patent No.: US 6,656,341 B2
(45) Date of Patent: Dec. 2, 2003

(54) METHOD OF ETCHING, AS WELL AS FRAME ELEMENT, MASK AND PREFABRICATED SUBSTRATE ELEMENT FOR USE IN SUCH ETCHING

(75) Inventors: Per Petersson, Lund (SE); Mikael Gustavsson, Malmö (SE); Jenny Sjöberg, Malmö (SE); Bin Xie, Lund (SE); Bjarni Bjarnason, Södra Sandby (SE); Gust Bierings, Vellinge (SE); Göran Frennesson, Lund (SE)

(73) Assignee: Obducat Aktiebolag, Malmo (SE)

( * ) Notice: Subject to any disclaimer, the term of this patent is extended or adjusted under 35 U.S.C. 154(b) by 23 days.

(21) Appl. No.: 09/954,014

(22) Filed: Sep. 18, 2001

(65) Prior Publication Data

US 2002/0086240 A1 Jul. 4, 2002

Related U.S. Application Data

(60) Provisional application No. 60/233,421, filed on Sep. 18, 2000.

(30) Foreign Application Priority Data

Sep. 19, 2000 (SE) ................................................ 0003326

(51) Int. Cl.[7] ............................ C25F 3/00; C25D 17/00; C25B 9/00; G03C 1/725
(52) U.S. Cl. .................. 205/667; 204/279; 204/224 M; 204/288.2; 430/318
(58) Field of Search ............................... 205/666, 667; 204/224 M, 279, 288.2, DIG. 7; 428/209; 430/318

(56) References Cited

U.S. PATENT DOCUMENTS 5,126,016 A    6/1992   Glenning et al. ........... 205/125

FOREIGN PATENT DOCUMENTS

| JP | 55058552 | 5/1980 |
| JP | 4044291  | 5/1992 |
| JP | 4168789  | 9/1992 |

*Primary Examiner*—Patrick Ryan
*Assistant Examiner*—Thomas H. Parsons
(74) *Attorney, Agent, or Firm*—Finnegan, Henderson, Farabow, Garrett & Dunner, L.L.P.

(57) ABSTRACT

In a method of etching a substrate having a surface layer of conductive material, a circuit pattern is transferred to the surface layer in a central surface area portion of the substrate by electrochemical etching. To prevent excessive current densities from forming at the periphery of the central surface area portion during the etching step, a frame adapted to attract electrical field is provided adjacent to the central surface area portion. The frame can be part of a separate frame element which is placed on the substrate before the etching step, or be incorporated in a resist coating on the substrate. The frame can be transferred to the resist coating by any suitable means, for example by photolithographic exposure through a mask with a suitable frame pattern. Alternatively, the frame can be incorporated in a prefabricated substrate element, to which the circuit pattern is transferred in the etching step.

27 Claims, 3 Drawing Sheets

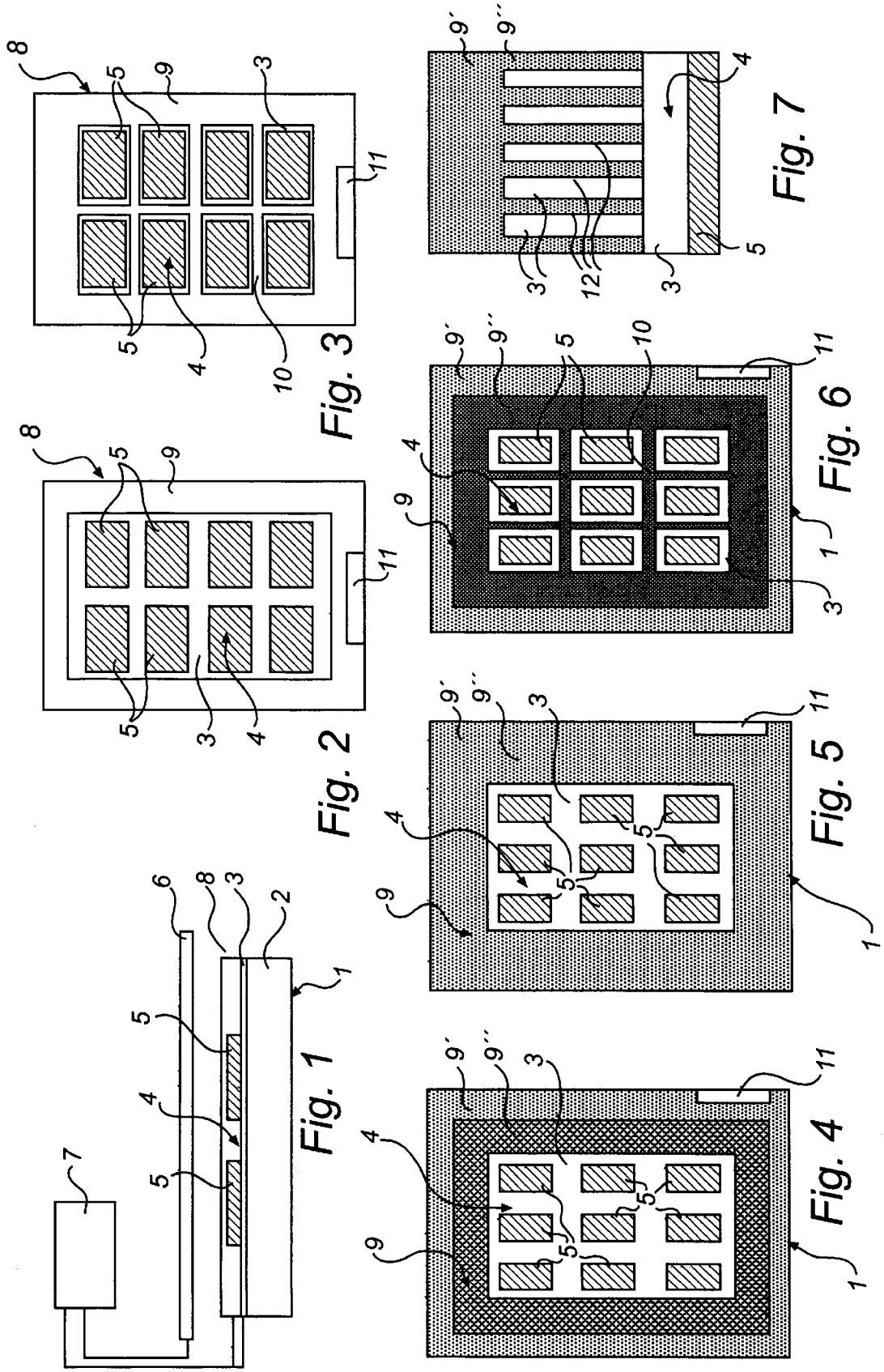

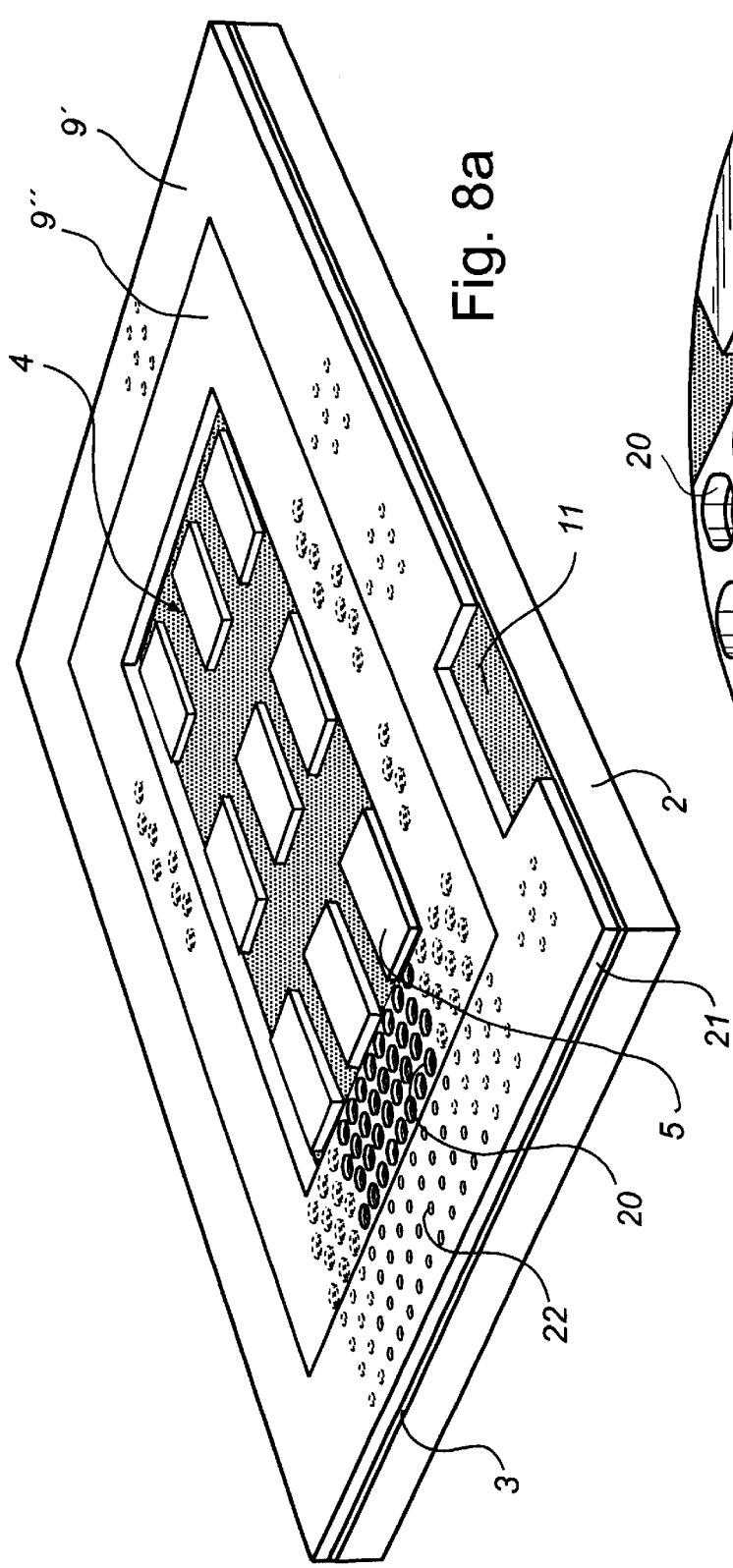
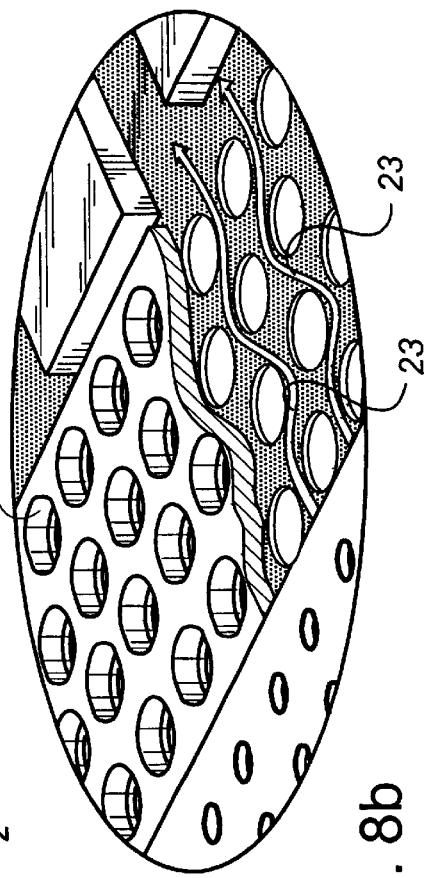
Fig. 8a
Fig. 8b

METHOD OF ETCHING, AS WELL AS FRAME ELEMENT, MASK AND PREFABRICATED SUBSTRATE ELEMENT FOR USE IN SUCH ETCHING

This application claims the benefit of U.S. Provisional Application No. 60/233,421, filed Sep. 18, 2000, the content of which is incorporated herein by reference, and claims the right to priority based on Swedish Application No. 0003326-6, filed Sep. 2000.

TECHNICAL FIELD

The present invention generally relates to electrochemical etching of a substrate having a surface layer of conductive material.

BACKGROUND OF THE INVENTION

Electrochemical etching is an established technique for pattern generation on substrates, e.g. in production of so-called PCB (Printed Circuit Board) or PWB (Printed Wire Board) as well as semiconductor wafers. In both cases, the substrate comprises a metal film adhered to a non-conductive base. Generally, a photosensitive resist coating is applied to the metal film, whereupon a lithographic process is used to transfer a desired pattern is from a mask or master to the resist coating, thereby uncovering selected parts thereof. The electrochemical etching step is effected by imposing an electrical current in a conductive etchant between the substrate and an opposite counter electrode, the substrate and the counter electrode being connected to a common power supply as anode and cathode, respectively. During this etching step, the uncovered parts of the metal film are dissolved and the pattern is transferred to the metal film. This type of electrochemical etching is for example known from EP-A1-0 392 738, EP-A2-0 563 744, and WO98/10121.

One major challenge in electrochemical etching is to achieve a uniform etching process over the surface of the substrate, while maintaining a high production yield. This is especially difficult to achieve when etching large substrates. Typical dimensions of substrates or panels used for production of PCB/PWB are 610×457 mm, although other dimensions are also commonly used. The combination of such a large area to be etched and thin metal films, typically 1–35 $\mu$m thick, makes the resistance distribution over the substrate of importance for the resulting etching process. Normally, the electrical current is supplied to the substrate at one or more contact areas at the periphery of the substrate. As a consequence, the resistance will increase towards the center of the substrate. The correspondingly decreasing current density towards the center will lead to a faster etching process at the periphery than at the center part of the substrate. This results in a non-uniformity of the etched pattern. In principle the same problem applies to thicker metal films. As the metal film becomes thinner during the process, the resistance from edge to center of the substrate will increase and lead to the above-described non-uniformity.

The achievement of a high degree of uniformity in the etched pattern also calls for careful optimization of the geometry and dimension of the counter electrode, the alignment of the counter electrode with the substrate, and the distance between the counter electrode and the substrate. Further, a uniform current distribution around the periphery of the substrate should be ascertained, necessitating many and/or large contact areas. Such optimization is difficult to combine with mass production at high throughput.

The uniformity of the etched pattern is also affected by the pattern layout, i.e. if the degree of exposed metal differs over the surface of the substrate, since areas with a high degree of exposed metal will exhibit a slower etching process than areas with a small degree of exposed metal.

The above problems are also evident in the production of semiconductors. Although the substrate in general has a smaller surface area, the number of individual circuits is very large and the metal film is very thin, typically 300 nm–3 $\mu$m. Therefore, the resistance distribution from edge to center of the substrate can influence the uniformity of the electrochemical etching process.

SUMMARY OF THE INVENTION

The object of the invention is to solve or alleviate some or all of the problems described above. More specifically, the invention should allow for production of etched items at an industrial scale with high quality, also based on substrates that have large surface areas and/or are provided with thin metal films.

This object is achieved, at least partially, by the method, frame element, mask and prefabricated substrate element as set forth in the appended claims.

By providing the frame adjacent to the central surface area portion to be etched, in accordance with the invention, it is possible to reduce or eliminate edge effects, i.e. prevent high current densities from forming at the periphery of central surface area portion, by the frame attracting any excess electrical field formed thereat. Such excess electrical field can be formed when the cathode is larger than the surface area portion to be etched or when the cathode is misaligned therewith. Thus, the frame provides for the use of one and the same counter electrode with different pattern layouts and substrate dimensions.

When properly designed, the frame is also capable of protecting the underlying surface layer such that an electrical current led into the surface layer during the etching step is evenly distributed around the periphery of the substrate. Thus, such a frame is capable of forming a shielded "distribution zone" in the underlying surface layer, in which the electrical current is allowed to distribute evenly around the central surface area portion that is to be etched electrochemically. Hence, by providing the frame at the periphery of the substrate, a uniform current distribution over the circumference of the central surface area portion can be ascertained. Consequently, a more uniform etching process than heretofore can be effected. The provision of the frame also allows for simplified contacting of the substrate, i.e. the use of fewer and/or smaller contact areas than in prior art methods, which is of importance for mass production.

According to a first aspect of the invention, the frame is included in a separate, electrically conductive frame element that is placed over the substrate during the etching step. Thus, the frame element has a conductive surface facing away from the substrate, i.e. towards the cathode. Such a frame element will prevent high current densities from forming at the periphery of central surface area portion, by the conductive surface of the frame element attracting electrical field. The frame element will also form a shielded "distribution zone" in the underlying surface layer.

According to a second aspect of the invention, the frame is formed in the resist coating. Compared to the first aspect of the invention, the inventive method is simplified, in that the step of applying a separate frame is eliminated, while retaining the above-identified benefits of the frame. Further, compared to the first aspect, the amount of electrical power required for the etching can be reduced since the area of bare metal generally is smaller.

According to the second aspect of the invention the frame comprises part of the resist coating as well as the underlying metal layer.

According to the second aspect, the frame can be provided in the resist coating simultaneously with the circuit pattern. In the case of photolithography, the resist coating can be exposed through a mask containing a frame pattern, as well as the circuit pattern to be etched in the central surface area portion. Alternatively, the circuit pattern can be included in a separate mask. It is also conceivable to provide, for patterning and subsequent etching, prefabricated substrates with a resist coating incorporating the frame pattern. In another conceivable alternative, a laminate structure including a resist coating defining at least the frame is attached to the substrate before the etching step.

According to a preferred embodiment of the second aspect, the frame includes a field distribution portion, which is arranged adjacent to the central surface area portion and which has a field distribution pattern uncovering the underlying surface layer to a given degree of exposure, so as to prevent excessive current densities from forming at the periphery of the central surface area portion during electrochemical etching thereof. More specifically, the field distribution portion minimizes the formation of high current densities at the peripheral edge of the central surface area portion by attracting electrical field. Thus, the influence of any misalignment between the cathode and the central surface area portion is reduced, as well as the influence of the geometry of the cathode. By optimizing the degree of exposure of the underlying surface layer in the field distribution pattern, it is possible to control the etching rate at the peripheral edge of the central surface area portion. Preferably, the degree of exposure in the field distribution portion is in the range of about 30–90%, preferably about 50–90%. This has been found to yield a suitably uniform current distribution, i.e. a suitably uniform etching rate, over the surface of the substrate. With a degree of exposure exceeding about 90%, there is a risk that the underlying conductive surface layer is fully removed during the etching step, leading to an undesired loss of electrical contact at the peripheral edge of the central surface area portion. If the degree of exposure is too low, the electrical field might be concentrated to the edges of the central surface area portion, yielding excessive current densities thereat. For the purpose of providing a distribution zone, i.e. to protect the underlying surface layer such that an electrical current led into the surface layer during the etching step is evenly distributed around the periphery of the substrate, the frame preferably has a circumferential periphery portion which uncovers the underlying surface layer to a degree of exposure in the range of about 0–60%, preferably about 0–50%. Normally, the periphery portion will have a degree of exposure near 0%, since there is little need for exposure in this part of the substrate. Any excess electrical field is primarily attracted to the exposed areas of the field distribution portion. However, for reasons of simplicity, the periphery region can have the same degree of exposure as the field distribution portion.

According to a further preferred embodiment of the invention, an internal frame structure is provided between individual circuits of the circuit pattern. In this internal frame structure the underlying surface layer is protected such that an electrical current led into said surface layer during said etching step is uniformly distributed around the periphery of the individual circuits as well. Thus, the internal frame structure provides conductors in the central surface area portion to reduce any differences in electrical current within the circuit pattern during the etching step, and also to prevent any uncontrolled disconnection of individual circuits during the etching step. By proper design of the internal frame structure it is thus possible to distribute the current uniformly between individual circuits, and balance the etching rate over the whole central surface area portion. The internal frame structure can be included in a separate, electrically conductive frame element that is placed over the substrate during the etching step, or be formed by forming a pattern in the resist coating. In the latter case, the internal frame structure extends from the field distribution portion of the frame and has a field distribution pattern uncovering the underlying surface layer to a given degree of exposure. By optimizing the degree of exposure, it is possible to balance the etching rate within the central surface area portion. It has been found that the degree of exposure of the underlying surface layer in the internal frame structure preferably is in the range of about 30–90%, preferably about 50–90%. With a degree of exposure exceeding about 90%, there is a risk that the underlying conductive surface layer is fully removed during the etching step, leading to an undesired loss of electrical contact within the central surface area portion. If the degree of exposure is too low, the electrical field might be concentrated to the edges of the internal frame structure, yielding excessive current densities thereat. Such uncontrolled excessive current densities could lead to undesired and uncontrolled disconnection of individual circuits during the etching step.

It has been found that, for optimum performance, the uncovered portions of the field distribution pattern in the frame, as well as in the internal frame structure, should be essentially uniformly distributed. It has also been found that the uncovered portions of the field distribution pattern should have lateral dimensions of at least about 100 $\mu$m, for the electrical field to adequately reach the underlying conductive surface layer through the uncovered portions. In one viable design of the field distribution pattern the uncovered portions are essentially circular, although other shapes could be used as well. The uncovered portions may have any geometrical form as, e.g., the form of any polygon or ellipse.

In one simple embodiment, the field distribution pattern is a screen pattern. Such a pattern can easily be generated by e.g. a laser printer to produce a mask used in a lithographic process for transfer of a pattern to the resist coating on the substrate.

In a preferred embodiment, the inventive method includes the step of forming, in the field distribution pattern of the field distribution portion and/or the internal frame structure, covered portions having such a shape and lateral dimension that individual circuits adjacent to one end of these covered portions automatically are electrically disconnected after a given time during the etching step. In this embodiment, the conductive material underneath each such covered portion will form an electrical connector which will be dissolved by the undercut inherent in electrochemical etching, at a certain stage of the etching process. Such undercut occurs at least towards the end of the etching step, when the electrical field is concentrated to the remaining portions of the uncovered surface layer. Thus, "electrical fuses" are integrated in the resist coating. By proper design of the field distribution pattern, selected parts of the central surface area portion can be automatically disconnected from the etching process after a certain etching time. Adequate fuse function in the production of PCB/PWB has been ascertained with covered portions in the form of elongate structures having a lateral dimension of about 50–100 $\mu$m to 1–2 mm. For production of semiconductors, the covered portions could have a smaller lateral dimension.

Preferably the elongate structures have the form of triangles, such that the uncovered portions of the metal layer becomes wider towards the central surface area portion.

BRIEF DESCRIPTION OF THE DRAWINGS

The invention will now be described in more detail with reference to the accompanying drawings, in which FIG. 1 is a side view of an arrangement in electrochemical etching according to a first aspect of the invention;

FIGS. 2–3 are top views of substrates for use in electrochemical etching according to alternative embodiments of the first aspect of the invention; and FIGS. 4–6 are top views of substrates for use in electrochemical etching according to alternative embodiments of the second aspect of the invention.

FIG. 7 is an enlarged top view illustrating a further embodiment of the second aspect.

FIG. 8 illustrates a further embodiment of the present invention.

DESCRIPTION OF PREFERRED EMBODIMENTS

Figure 9:
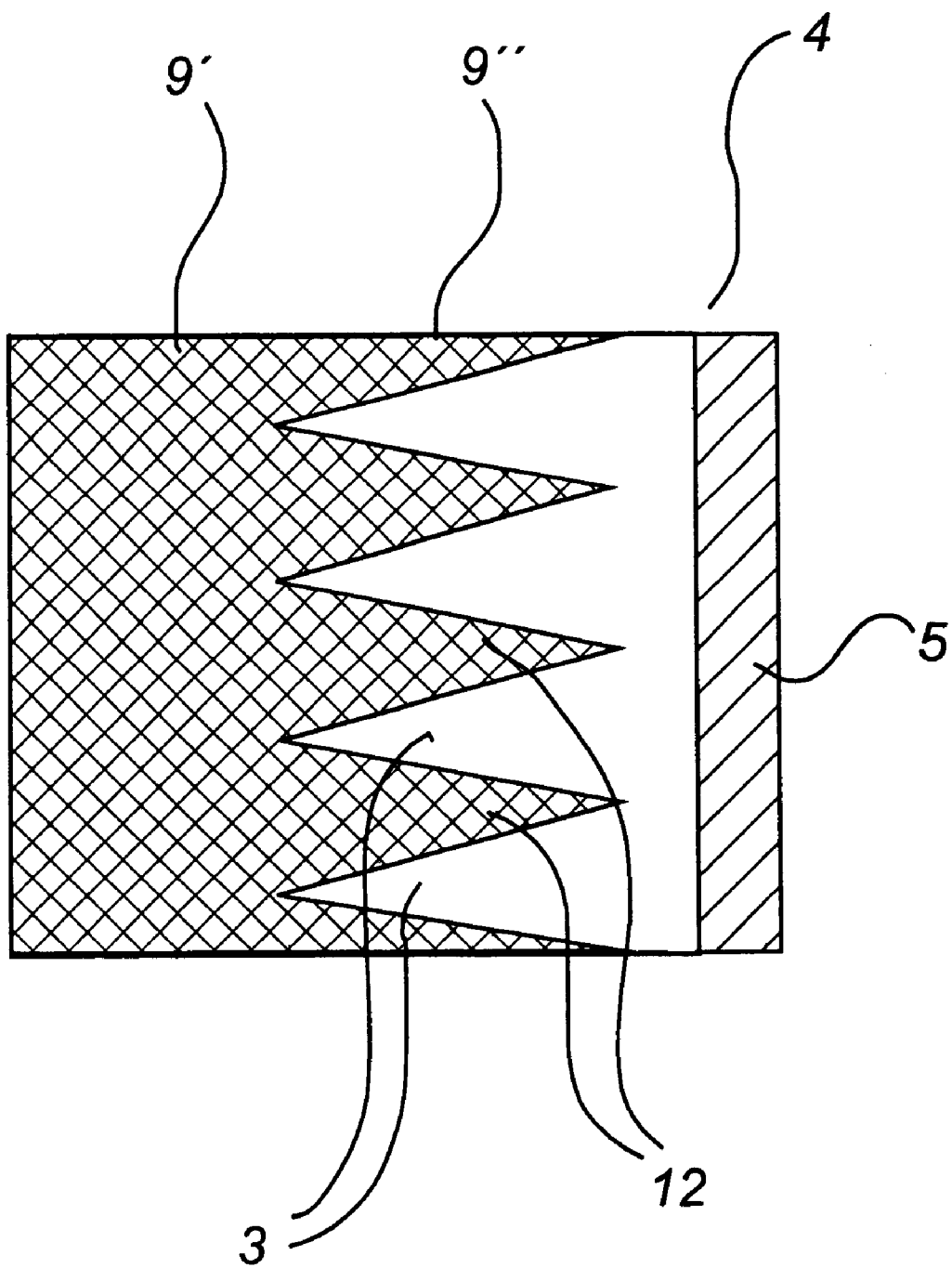
FIG. 9 is an enlarged top view illustrating a further embodiment of the second aspect.

FIGS. 1–3 show arrangements for use in a method of etching according to a first aspect of the invention. A substrate 1 having a base 2 of non-conductive material and a conductive metal film 3, is provided with a resist coating uncovering selected parts of the metal film 3 in a central circuit portion 4 of the substrate 1. Typically, the resist coating in this central circuit portion 4 defines several individual circuits 5 (indicated as hatched areas in FIGS. 1–3). A counter electrode 6 is arranged in co-planar fashion with the substrate 1. A power supply 7 is connected to the electrode 6 and the metal film 3 to impose an electrical current through an etchant (not shown) between the electrode 6 and the substrate 1, thereby dissolving the uncovered parts of the metal film 3. A separate frame element 8 is placed in surrounding relationship to the individual circuits 5 in the central circuit portion 4. The frame element 8 which is made of conductive material, at least on the side facing the electrode 6, is connected to the power supply 7, to the same polarity as the metal film 3.

FIG. 2 shows a first frame construction, wherein the frame element 8 is designed to form a surrounding frame 9 around the central circuit portion 4. Between the individual circuits 5 the conductive metal film 3 is normally fully exposed. The frame element 8 is used in a method of etching in which the resist coating is first applied to the metal film 3, whereupon the resist coating is removed in a defined pattern in the central circuit portion 4, thereby forming the individual circuits 5. This can be done in any conventional way, such as by photolithography, nanoimprint etc. Then, the frame element 8 is placed on the substrate 1 to provide the frame 9, whereupon the exposed parts of the metal film 3 is selectively dissolved in an electrochemical etching step. During this etching step, the frame 9 attracts excess electrical field, to thereby prevent excessive current densities from forming at the periphery of the central circuit portion 4. Additionally, the frame element 8 shields the underlying metal film 3 to form a distribution zone, in which the current led into the metal film 3 from the power supply 7 can be uniformly distributed around the periphery of the central circuit portion 4.

FIG. 3 shows a second alternative frame construction, in which the frame element 8 also includes an internal frame structure 10 covering at least partly the area between the individual circuits 5 in the central circuit portion 4. The frame element 8 of FIG. 3 provides for further shielded distribution of current around the periphery of the individual circuits 5, and allows for further balancing of the etching rate in the central circuit portion 4 during the etching step, by preventing excessive current densities from forming at the periphery of the individual circuits 5.

The arrangements of FIGS. 1–3 also provide for simplified contacting of the substrate 1. Only one small contact area 11 is necessary, due to the provision of the above-mentioned distribution zone underneath the frame 9. If the conductive frame element 8 is placed directly on the metal film 3 of the substrate 1, it is conceivable to contact both the frame element 8 and the substrate 1 in this contact area 11.

FIGS. 4–6 show arrangements for use in a method of etching according to a second aspect of the invention. Although not shown on the drawing, a similar arrangement as in FIG. 1 can be used for effecting the etching process. The second aspect is based on the basic insight that the frame 9, as well as the internal frame structure 10, can be integrated with the resist coating on the substrate 1. Therefore, the following description will focus on the design of the resist coating. Like FIGS. 2–3, FIGS. 4–6 show the substrate 1 before the etching step, wherein parts in FIGS. 4–6 corresponding to parts in FIGS. 1–3 have the same reference numerals.

In FIG. 4, the metal film 3 of the substrate 1 is provided with a resist coating. The resist coating is patterned to define individual circuits 5 in the central circuit portion 4, as well as the frame 9 circumscribing this central portion 4. The frame 9 includes an outer periphery portion 9' which is designed to shield the underlying metal film 3, to thereby provide the distribution zone discussed above in relation to FIGS. 1–3. To this end, the periphery portion 9' generally has a low degree of exposure of the underlying metal film 3, in the illustrated example about 20%. The frame 9 also includes a field distribution portion 9", which is designed to attract excess field during the etching step, to thereby prevent any concentration of electrical current to the edges of the central circuit portion 4. To this end, the field distribution portion 9" generally has a degree of exposure of the underlying metal film 3 that is comparable to the average degree of exposure of the individual circuits 5, in the illustrated example about 50%. It should be noted that it is possible to use only one small contact area 11, shown as an uncovered area in the frame 9, since the current will be essentially uniformly distributed around the periphery of the substrate 1 in the metal film 3 underlying the frame 9, especially its periphery portion 9'. Thus, the design provides for ease of contacting the substrate 1, as well as a possibility to balance the etching rate over the substrate 1, even for substrates 1 having a large surface area.

FIG. 5 shows an embodiment similar to the one in FIG. 4, but for fact that the periphery and field distribution portions 9', 9" of the frame 9 have the same degree of exposure, in this example about 50%. In this case, one and the same frame pattern performs the dual function of attracting excess electrical field and forming a distribution zone for electrical current around the periphery of the substrate 1.

The embodiment of FIG. 6 resembles that of FIG. 4, but for the inclusion of an internal frame structure 10 which extends from the field distribution portion 9" and between the individual circuits 5 in the central circuit portion 4. In this example, the internal frame structure 10 has the same degree of exposure of the underlying metal film 3 as the field distribution portion 9″, i.e. approximately 50%. The design shown in FIG. 6 provides for a uniform distribution of electrical current to the periphery of the individual circuits 5 during the etching step, with simultaneous attraction of excess field to prevent any concentration of electrical current to the edges of the internal frame structure 10. It should be noted that the internal frame structure 10 also could be incorporated in the embodiment of FIG. 5.

FIG. 7 shows a cut-out of a substrate embodying another feature of the invention. Here, the covered parts of the field distribution pattern, in this case of the field distribution portion 9″, are formed as elongate structures 12 extending between the periphery portion 9′ and the central circuit portion 4. The structures 12 have such a lateral dimension, typically about 50–100 μm to 1–2 mm, that selected parts of the central circuit portion 4 are disconnected automatically after a given time during the etching step. More specifically, the uncovered metal film 3 between the structures 12 will be dissolved comparatively early during the etching process, thereby forming "conductors" in the metal film 3 underlying the elongate structures 12. These conductors will also be dissolved, by the undercut inherent in the etching process, the time until such dissolution being determined by the shape and dimension of the elongate structures 12, as well as the local current density. It should also be noted that the very same design also allows for similar balancing of etching rate as the other embodiments shown in FIGS. 4–6.

FIG. 8a is a perspective view of another embodiment of the invention. The embodiment of FIG. 8a also resembles that of FIG. 4 A substrate 2 is covered with a metal layer 3 on which a resist layer 21 is applied. A pattern is applied in the resist layer 21 to define a field distribution portion 9″ as well as a periphery portion 9′. In this example, the degree of exposure of the underlying metal film 3 in the field distribution portion 9″, is approximately 50%. The field distribution portion 9″ exhibits a pattern with circular holes 20. The periphery portion 9′ also exhibits a pattern with holes 22, which however are smaller and cover a smaller area than the holes in the field distribution portion. The holes 20, 22 are shown only on a small part of the frame. Also shown in FIG. 8a is the contact area 11 and a central circuit portion 4 with numerous separate circuits 5. The structure shown in FIG. 8 displays the situation after the etching has proceeded to such an extent that the surface layer has been etched through in the parts of the frame which are not covered by the resist layer. Thus, the situation shown in FIG. 8b is when the metal layer in the holes just have been etched through but when there still remain metal in the central surface area. The metal layer in the central surface area is shown intact in FIG. 8b but in reality the metal layer in the central surface area may be etched through in some places. In FIG. 8b the field distribution portion 9″ is shown in more detail. In FIG. 8b the resist layer in the field distribution portion has been removed from a small part to show the underlying metal layer in which holes 20 have been etched. However, there are still current paths 23 in the metal layer in the frame making electrical contact with the central circuit portion 4.

FIG. 9 shows a cut-out of a substrate embodying another feature of the invention. Here, the covered parts of the field distribution pattern, in this case of the field distribution portion 9″, are formed as elongate structures 12 extending between the periphery portion 9′ and the central circuit portion 4. The structures 12 have the shape of triangles which becomes more narrow in the direction towards the central surface area portion. They are typically about 200–1000 μm wide at their base, so that selected parts of the central circuit portion 4 are disconnected automatically after a given time during the etching step. More specifically, the uncovered metal film 3 between the structures 12 will be dissolved comparatively early during the etching process, thereby forming "conductors" in the metal film 3 underlying the elongate structures 12. It should also be noted that the very same design also allows for similar balancing of etching rate as the other embodiments shown in FIGS. 4–7.

In the method of etching according to the second aspect, the resist coating is first applied to the metal film 3, whereupon the resist coating is removed in a defined pattern in the central circuit portion 4, thereby forming the individual circuits 5. Typically, the frame 9, and optionally the internal frame structure 10, is formed simultaneously with the circuit pattern. The patterning can be done in any conventional way, such as by photolithography, nanoimprint etc. Subsequently, the uncovered parts of the metal film 3 are selectively dissolved in an electrochemical etching step.

If the resist coating is patterned by photolithography, the frame 9 can be printed on a transparent sheet forming a mask or master for use in the lithographic process. If desired, an internal frame structure and/or the circuit pattern can also be printed on the same mask.

Alternatively, the frame 9, and optionally the internal frame structure 10, can be incorporated in a laminate structure (not shown). Such a laminate structure is suitably attached to the metal film 3 of the substrate 1 in a separate step after the removal of the resist coating in a defined circuit pattern in the central circuit portion 4.

It is also conceivable to provide a prefabricated substrate element (not shown) having a surface layer of metal and an overlying resist coating, wherein the frame, and optionally the internal frame structure, is provided in the resist coating already on delivery. This prefabricated substrate element can then, in a simplified subsequent process, be provided with a circuit pattern and etched electrochemically.

It should also be noted that the first and second aspects can be combined, for example in that the internal frame structure 10 is formed in the resist coating, and that a separate frame element 8 is used to form the frame 9 around the central circuit portion 4. It is also conceivable to provide the frame element 8, on the side facing the electrode 6, with a resist coating having a field distribution pattern similar to the one of the periphery portion 9′ and/or the field distribution portion 9″ as discussed above in relation to the second aspect.

It is also to be understood that the invention is applicable for production of any kind of circuitry, such as PCB/PWB, semiconductor wafers, LCD panels etc.

What is claimed is:

1. Method of etching, comprising the steps of applying a resist coating on a substrate having a surface layer of conductive material; removing the resist coating in a defined circuit pattern in a central surface area portion of the substrate; and electrochemically etching said central surface area portion, thereby transferring said circuit pattern to said surface layer, characterized by the step of providing a frame adjacent to said central surface area portion, said frame being adapted to attract electrical field and thereby prevent excessive current densities from forming at the periphery of said central surface area portion during electrochemical etching thereof.

2. Method according to claim 1, comprising the step of forming said frame by forming a pattern in said resist coating.

3. Method according to claim 2, wherein the frame includes a field distribution portion being provided adjacent to said central surface area portion and having a field distribution pattern uncovering said surface layer to a given degree of exposure.

4. Method according to claim 3, wherein the degree of exposure of the surface layer in the field distribution portion is in the range of about 30–90%, preferably about 50–90%.

5. Method according to claim 3, wherein the frame has a circumferential periphery portion in which the underlying surface layer is protected such that an electrical current led into said surface layer during said etching step is uniformly distributed around the periphery of the substrate, wherein in said periphery portion the underlying surface layer is preferably uncovered to a degree of exposure in the range of about 0–60%, most preferably about 0–50%.

6. Method according to claim 3, wherein uncovered portions of said field distribution pattern are essentially uniformly distributed.

7. Method according to claim 3, wherein uncovered portions of said field distribution pattern are essentially circular.

8. Method according to claim 3, wherein uncovered portions of said field distribution pattern have lateral dimensions of at least about 100 μm.

9. Method according to claims 3, wherein said field distribution pattern is a screen pattern.

10. Method according to claims 3, further comprising the step of forming covered portions of said field distribution pattern having such a shape and lateral dimension that individual circuits adjacent to one end of said covered portions automatically are electrically disconnected after a given time during said etching step.

11. Method according to claim 10, wherein said covered portions are elongate structures having a lateral dimension of about 50–100 μm to 1–2 mm.

12. Method according to claim 2, comprising the step of forming at least one uncovered contact area in the frame, the electrical current being led into said surface layer through said contact area during said etching step.

13. Method according to claim 1, further comprising the step of providing an internal frame structure between individual circuits of said circuit pattern, wherein in said internal frame structure the underlying surface layer is protected such that an electrical current led into said surface layer during said etching step is uniformly distributed around the periphery of the individual circuits.

14. Method according to claim 13, comprising the step of forming said internal frame structure by forming a pattern in said resist coating.

15. Method according to claim 13, wherein said internal frame structure extends from the field distribution portion and has a field distribution pattern uncovering said surface layer to a given degree of exposure.

16. Method according to claim 15, wherein the degree of exposure of the underlying surface layer in the internal frame structure is in the range of about 30–90%, preferably about 50–90%.

17. Method according to claim 13, wherein the step of providing the internal frame structure includes placing a separate, electrically conductive frame element over the substrate.

18. Method according to claim 1, wherein the step of providing the frame includes placing a separate, electrically conductive frame element over the substrate.

19. Method according to claim 1, wherein the step of providing the frame includes attaching a laminate structure, which includes a resist coating defining at least the frame, to the conductive surface layer of the substrate.

20. Frame element for use in a method according to claim 18, which defines the frame and has at least one surface made of conductive material, and which is adapted to overly said substrate during the etching step, said surface facing away from said substrate.

21. Frame element according to claim 20, which also defines the internal frame structure used in the method according to claim 17.

22. Mask for use in a method according to claim 1, which is adapted to transfer a frame pattern to the resist coating on said surface layer, preferably by means of photolithography, said frame pattern including at least said frame.

23. Mask according to claim 22, including a centrally located master pattern which in said transfer forms said circuit pattern in the resist coating.

24. Prefabricated substrate element comprising a surface layer of conductive material and a resist coating overlying said surface layer, a central surface area portion of said resist coating being adapted to receive a circuit pattern, characterized by a frame including a field distribution portion said field distribution portion having a field distribution pattern, formed in the resist coating adjacent to said central surface area portion, uncovering said surface layer to a given degree of exposure, thereby attracting electrical field and preventing excessive current densities from forming at the periphery of said central surface area portion during said electrochemical etching step.

25. Prefabricated substrate element according to claim 24, wherein the frame includes a circumferential periphery portion, in which the underlying surface layer is protected such that an electrical current led into said surface layer during an electrochemical etching step is evenly distributed around the periphery of the substrate element.

26. Prefabricated substrate element according to claim 24, further comprising an internal frame structure which defines individual circuit-receiving areas in said central surface area portion, said internal frame structure protecting the underlying surface layer such that an electrical current led into said surface layer during said electrochemical etching step is uniformly distributed around the periphery of the individual circuit-receiving areas during electrochemical etching thereof.

27. Prefabricated substrate element according to claim 26, wherein the internal frame structure has a field distribution pattern uncovering said surface layer to a given degree of exposure, to prevent excessive current densities from forming at the periphery of the individual circuit-receiving areas during said electrochemical etching step.

* * * * *